(12) United States Patent
Miyahara et al.

(10) Patent No.: US 8,334,541 B2
(45) Date of Patent: Dec. 18, 2012

(54) SIC SEMICONDUCTOR DEVICE

(75) Inventors: Shinichiro Miyahara, Nisshin (JP);
Hidefumi Takaya, Toyota (JP);
Masahiro Sugimoto, Toyota (JP); Jun Morimoto, Toyota (JP); Yukihiko Watanabe, Nagoya (JP)

(73) Assignees: DENSO CORPORATION, Kariya (JP);
Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 13/177,747

(22) Filed: Jul. 7, 2011

(65) Prior Publication Data
US 2012/0012860 A1 Jan. 19, 2012

(30) Foreign Application Priority Data

Jul. 16, 2010 (JP) ................................ 2010-161766

(51) Int. Cl.
*H01L 27/088* (2006.01)
(52) U.S. Cl. .......................................... 257/77; 438/197
(58) Field of Classification Search .................. 438/931; 257/76, 77, 288, E27.06, E27.099
See application file for complete search history.

(56) References Cited

U.S. PATENT DOCUMENTS

| 5,264,713 | A | * | 11/1993 | Palmour | 257/77 |
| 5,693,569 | A | * | 12/1997 | Ueno | 438/270 |
| 5,726,463 | A | * | 3/1998 | Brown et al. | 257/77 |
| 5,804,483 | A | * | 9/1998 | Harris | 438/268 |
| 7,005,678 | B2 | * | 2/2006 | Kumar et al. | 257/77 |
| 7,538,353 | B2 | * | 5/2009 | Huang et al. | 257/77 |
| 8,071,482 | B2 | * | 12/2011 | Kawada | 438/704 |

FOREIGN PATENT DOCUMENTS

JP 3489358 B2 11/2003

* cited by examiner

*Primary Examiner* — Thao P. Le
(74) *Attorney, Agent, or Firm* — Posz Law Group, PLC

(57) ABSTRACT

A SiC semiconductor device includes a reverse type MOSFET having: a substrate; a drift layer and a base region on the substrate; a base contact layer and a source region on the base region; multiple trenches having a longitudinal direction in a first direction penetrating the source region and the base region; a gate electrode in each trench via a gate insulation film; an interlayer insulation film covering the gate electrode and having a contact hole, through which the source region and the base contact layer are exposed; a source electrode coupling with the source region and the base region through the contact hole; a drain electrode on the substrate. The source region and the base contact layer extend along with a second direction perpendicular to the first direction, and are alternately arranged along with the first direction. The contact hole has a longitudinal direction in the first direction.

10 Claims, 7 Drawing Sheets

US 8,334,541 B2

SIC SEMICONDUCTOR DEVICE

CROSS REFERENCE TO RELATED APPLICATION

This application is based on Japanese Patent Application No. 2010-161766 filed on Jul. 16, 2010, the disclosure of which is incorporated herein by reference.

TECHNICAL FIELD

The present invention relates to a SiC semiconductor device including a MOSFET.

BACKGROUND

Conventionally, Japanese Patent No. 3489358 teaches a SiC (i.e., silicon carbide) semiconductor device having a vertical MOSFET as a vertical insulated gate type transistor. As shown in FIG. 9A, in the device, a longitudinal direction of a $P^+$ conductive type contact region J2 coupled with a P conductive type base region and a longitudinal direction of a $N^+$ conductive type source region J1 and a P conductive type base region are in parallel to a longitudinal direction of a trench J3, which provides a trench gate structure. A contact hole J4 formed in an interlayer insulation film is in parallel to the longitudinal direction of the trench J3. The $N^+$ conductive type source region J1 and the $P^+$ conductive type contact region J2 are electrically coupled with the source electrode through the contact hole.

However, in a conventional semiconductor device, when a cell pitch is reduced for micro-fabrication, a width between the source region J1 coupled with a source electrode and the contact region J2 is narrowed, as shown in FIG. 9B. Thus, contact between the contact region and the source electrode may not be sufficient.

SUMMARY

In view of the above-described problem, it is an object of the present disclosure to provide a SiC semiconductor device including a MOSFET. In the device, a contact area between a contact region and a source electrode is sufficient.

According to a first aspect of the present disclosure, a SiC semiconductor device includes a reverse type MOSFET. The MOSFET includes: a substrate having a first conductive type or a second conductive type and made of SiC; a drift layer having the first conductive type and made of SiC, wherein the drift layer is disposed on the substrate and has an impurity concentration lower than the substrate; a base region having the second conductive type and made of SiC, wherein the base region is disposed on the drift layer; a base contact layer having the second conductive type and made of SiC, wherein the base contact layer is disposed on the base region and has an impurity concentration higher than the base region; a source region having the first conductive type and made of SiC, wherein the source region is disposed on the base region and has an impurity concentration higher than the drift layer; a plurality of trenches having a stripe pattern in a first direction as a longitudinal direction of the stripe pattern, wherein each trench is disposed on a surface of the source region, penetrates the base region and reaches the drift layer; a gate insulation film disposed on an inner wall of each trench; a gate electrode disposed on the gate insulation film in each trench; an interlayer insulation film covering the gate electrode and having a contact hole, through which the source region and the base contact layer are exposed from the interlayer insulation film; a source electrode electrically coupling with the source region and the base region through the contact hole; and a drain electrode disposed on the substrate and opposite to the drift layer. The MOSFET provides a reverse channel area in a surface portion of the base region, which is disposed on a sidewall of each trench. The MOSFET controls an application voltage to the gate electrode so that the reverse channel area is generated, and the MOSFET flows current between the source electrode and the drain electrode via the source region and the drift layer. The source region and the base contact layer extend along with a second direction, which is perpendicular to the first direction. The source region and the base contact layer are alternately arranged along with the first direction. The contact hole has a longitudinal direction in the first direction.

In the above device, the longitudinal direction of the contact hole, i.e., the longitudinal direction of an boundary between the source electrode and the source region or the base contact layer is perpendicular to the extending direction of the source region and the base contact layer. Accordingly, a boundary width between the source electrode and the source region or the base contact layer is equal to the width of the contact hole. Accordingly, the contact area between the source electrode and the source region or the base contact layer is sufficiently wide. Thus, even when the integration of the device increases, the contact area between the source electrode and the source region or the base contact layer is sufficient.

According to a second aspect of the present disclosure, a SiC semiconductor device includes an accumulation type MOSFET. The MOSFET includes: a substrate having a first conductive type or a second conductive type and made of SiC; a drift layer having the first conductive type and made of SiC, wherein the drift layer is disposed on the substrate and has an impurity concentration lower than the substrate; a base region having the second conductive type and made of SiC, wherein the base region is disposed on the drift layer; a base contact layer having the second conductive type and made of SiC, wherein the base contact layer is disposed on the base region and has an impurity concentration higher than the base region; a source region having the first conductive type and made of SiC, wherein the source region is disposed on the base region and has an impurity concentration higher than the drift layer; a plurality of trenches having a stripe pattern in a first direction as a longitudinal direction of the stripe pattern, wherein each trench is disposed on a surface of the source region, penetrates the base region and reaches the drift layer; a gate insulation film disposed on an inner wall of each trench; a channel layer having the first conductive type and made of SiC, wherein the channel layer is disposed between the gate insulation film and the base region in each trench; a gate electrode disposed on the gate insulation film in each trench; an interlayer insulation film covering the gate electrode and having a contact hole, through which the source region and the base contact layer are exposed from the interlayer insulation film; a source electrode electrically coupling with the source region and the base region through the contact hole; and a drain electrode disposed on the substrate and opposite to the drift layer. The MOSFET controls an application voltage to the gate electrode so that an accumulation type generated in the channel layer is controlled, and the MOSFET flows current between the source electrode and the drain electrode via the source region and the drift layer. The source region and the base contact layer extend along with a second direction, which is perpendicular to the first direction. The source region and the base contact layer are alternately arranged along with the first direction. The contact hole has a longitudinal direction in the first direction.

In the above device, the longitudinal direction of the contact hole, i.e., the longitudinal direction of an boundary between the source electrode and the source region or the base contact layer is perpendicular to the extending direction of the source region and the base contact layer. Accordingly, a boundary width between the source electrode and the source region or the base contact layer is equal to the width of the contact hole. Accordingly, the contact area between the source electrode and the source region or the base contact layer is sufficiently wide. Thus, even when the integration of the device increases, the contact area between the source electrode and the source region or the base contact layer is sufficient.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION

First Embodiment

A MOSFET having a reverse type trench gate structure as an element in a SiC semiconductor device will be explained according to a first embodiment.

Figure 1:
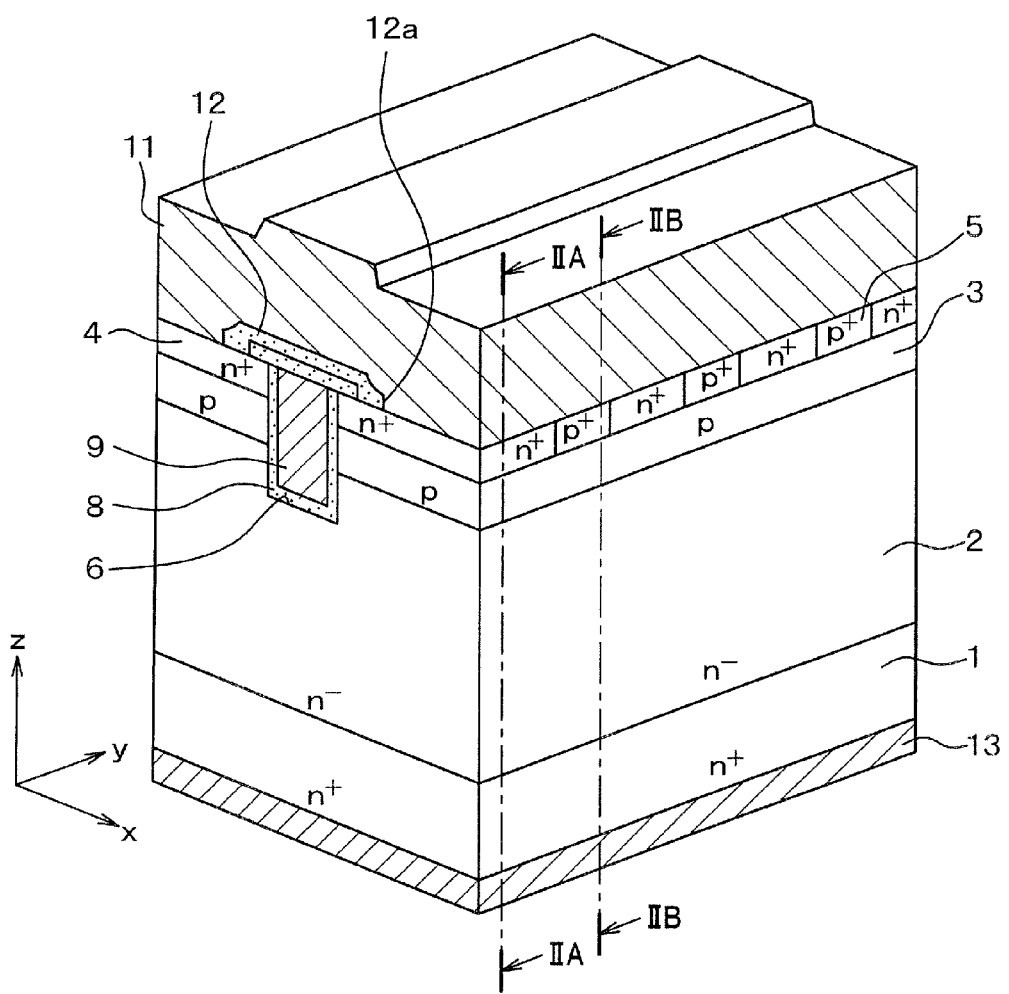
FIG. 1 is a diagram showing a perspective view of a MOSFET having a trench gate structure according to a first embodiment.
Figure 2A:
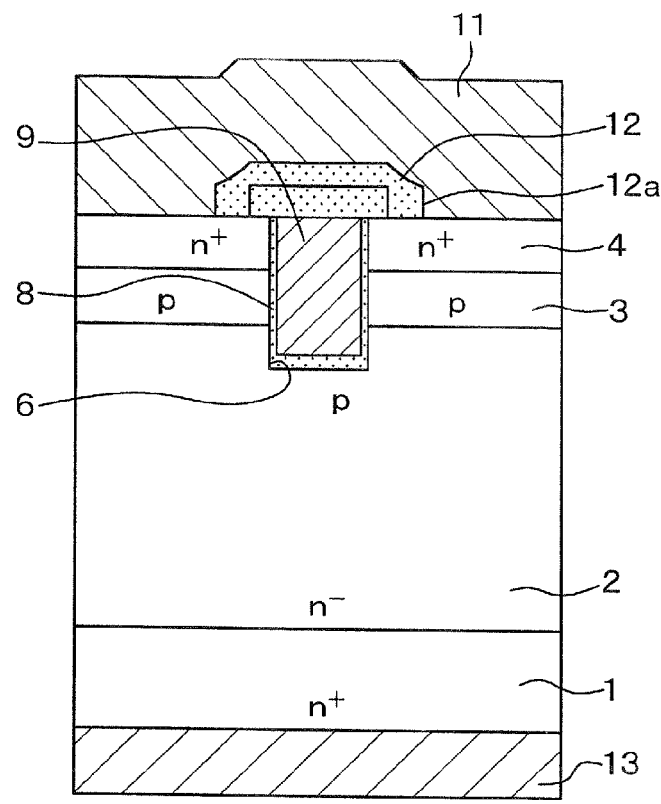
FIG. 2A is a diagram showing a cross sectional view of the MOSFET taken along line IIA-IIA in FIG. 1.
Figure 2B:
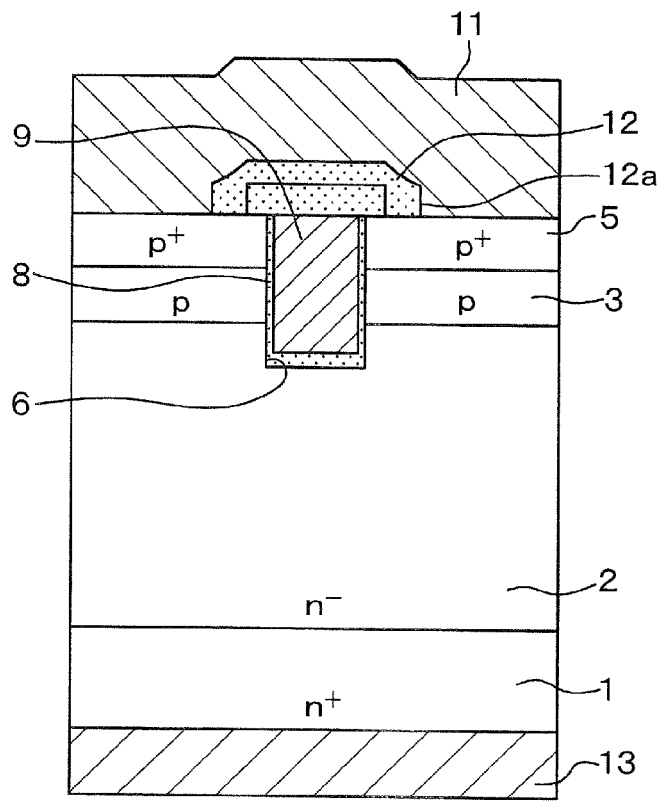
FIG. 2B is a diagram showing a cross sectional view of the MOSFET taken along line IIB-IIB in FIG. 1.
Figure 3:
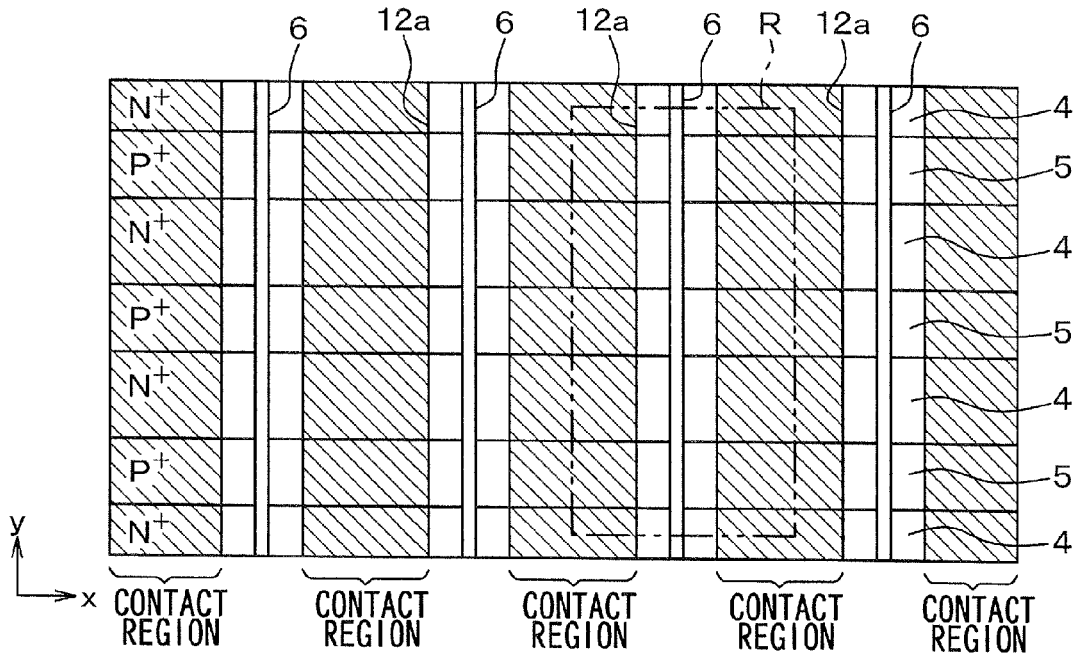
FIG. 3 is a diagram showing an upper plan view of the MOSFET in FIG. 1.

FIG. 1 shows a part of the MOSFET according to the present embodiment. The part of the MOSFET in FIG. 1 corresponds to one cell of the MOSFET. In the MOSFET, multiple cells are arranged in line, and each cell is shown in FIG. 1. FIG. 2A shows a cross sectional view of the MOSFET taken along line IIA-IIA in FIG. 1, and the cross sectional view is in parallel to a X-Z plane in FIG. 1. FIG. 2B shows a cross sectional view of the MOSFET taken along line IIB-IIB in FIG. 1, and the cross sectional view is in parallel to a X-Z plane in FIG. 1. FIG. 3 shows an upper layout view of the MOSFET in FIG. 1. The part of the MOSFET in FIG. 1 corresponds to a region R in FIG. 3.

The MOSFET includes a $N^+$ conductive type substrate 1 made of SiC as a semiconductor substrate. The substrate 1 has a N conductive type impurity concentration of, for example, $1.0 \times 10^{19}$ $cm^{-3}$. The N conductive type impurity is, for example, phosphorous. The thickness of the substrate 1 is about 300 micrometers. A $N^-$ conductive type drift layer 2 is formed on the surface of the substrate 1. The drift layer 2 is made of SiC, and has the N conductive type impurity concentration of, for example, in a range between $3.0 \times 10^{15}$ $cm^{-3}$ and $1.0 \times 10^{16}$ $cm^{-3}$. The N conductive type impurity is, for example, phosphorous. The thickness of the drift layer 2 is in a range between 10 micrometers and 15 micrometers. The impurity concentration in the drift layer 2 may be constant in a depth direction. Alternatively, the impurity concentration distribution of the drift layer 2 may be changed in the depth direction. For example, the impurity concentration of the drift layer 2 on the substrate side is higher than that on an opposite side. Thus, the impurity concentration of the rift layer 2 increases as a distance from the substrate 1 is reduced. Contrary, the impurity concentration of a surface portion of the drift layer 2 may be higher than that near the substrate 1. Thus, when a part of the drift layer 2 has high impurity concentration, an inner resistance of the drift layer 2 is reduced. Thus, an on-state resistance is reduced.

A P conductive type base region 3 is formed in a surface portion of the rift layer 2. Further, a $N^+$ conductive type source region 4 and a $P^+$ conductive type body layer 5 as a base-contact region are formed in an upper portion of the base region 3.

The base region 3 has a P conductive type impurity concentration in a range between $5.0 \times 10^{16}$ $cm^{-3}$ and $2.0 \times 10^{19}$ $cm^{-3}$. The P conductive type impurity is, for example, boron or aluminum. The thickness of the base region 3 is about 2.0 micrometers. The source region 4 has a surface concentration of a N conductive type impurity such as phosphorus in a surface portion of the source region 4, which is $1.0 \times 10^{21}$ $cm^{-3}$, for example. The thickness of the source region 4 is about 0.3 micrometers. The body layer 5 has a surface concentration of a P conductive type impurity such as boron or aluminum in a surface portion of the body layer 5, which is $1.0 \times 10^{21}$ $cm^{-3}$, for example. The thickness of the source region 4 is about 0.3 micrometers.

The base region 3, the source region 4 and the body layer 5 are arranged on both sides of the trench gate structure. The source region 4 and the body layer 5 have a stripe pattern shape, and are alternately arranged. Thus, the source region 4 and the body layer 5 lay out in a stripe manner. A longitudinal direction of the source region 4 and the body layer 5 is perpendicular to a longitudinal direction of the trench gate structure.

Multiple trenches 6 having a stripe pattern shape are formed to penetrate the base region 3 and the source region 4 and to reach the drift layer 2. A width of each trench 6 is in a range between 0.7 micrometers and 2.0 micrometers. A depth of the trench 6 is equal to or larger than 2.0 micrometers. For example, the depth of the trench 6 is 2.4 micrometers. The base region 3, the source region 4 and the body layer 5 are arranged to contact a sidewall of the trench 6. Specifically, the source region 4 and the body layer 5 are disposed between adjacent trenches 6 so that the source region 4 and the body layer 5 couple between the adjacent trenches 6.

Further, an inner wall of the trench 6 is covered with a gate oxide film 8. A gate electrode 9 made of doped poly silicon is formed on the surface of the gate oxide film 8. The gate electrode 9 fills the trench 6. The gate oxide film 85 is formed by thermally oxidizing the inner wall of the trench 6. The thickness of the gate oxide film 8 on the side wall of the trench 6 and the thickness of the gate oxide film 8 on the bottom of the trench 6 are about 100 nanometers.

Thus, the trench gate structure is formed. The trench gate structure extends along a longitudinal direction as Y direction in FIG. 1. Multiple trench gate structures are arranged in parallel to the X direction in FIG. 1 so that the trench gate structures provide a stripe pattern. A longitudinal direction of the trench gate structure is perpendicular to the longitudinal direction of the source region 4 and the body layer 5. Both of the source region 4 and the body layer 5 contact the side wall of the trench 6.

A source electrode 11 and a gate wiring (not shown) are formed on the surface of the source region 4, the body layer 5 and the gate electrode 9. The source electrode 11 and the gate wiring are made of multiple metals such as Ni/Al. At leas a part of the source electrode 11 and the gate wiring, which contact a N conductive type SiC element such as the source region 4 and the gate electrode 9 in case of N conductive type impurity is doped, is made of metal that is capable of contacting with the N conductive type SiC element with ohmic contact. At leas a part of the source electrode 11 and the gate wiring, which contact a P conductive type SiC element such as the body layer 5 and the gate electrode 9 in case of P conductive type impurity is doped, is made of metal that is capable of contacting with the P conductive type SiC element with ohmic contact.

The source electrode 11 and the gate wiring are electrically insulated from other layers since they are formed on an interlayer insulation film 12. The source electrode 11 is electrically coupled with the source region 4 and the body layer 5 via a contact hole 12a, which is formed in the interlayer insulation film 12. The gate wiring is electrically coupled with the gate electrode 9 via a contact hole (not shown), which is formed in the interlayer insulation film 12. A part hatched in FIG. 3 represents the contact hole 12a for exposing the body layer 5 and the source region 4 from the interlayer insulation film 12. The part provides a contact region with the source electrode 11, the source region 4 and the body layer 5.

A drain electrode 13 is formed on a backside of the substrate 1. The drain electrode 13 is electrically coupled with the substrate 1. Thus, the N channel type trench gate reverse MOSFET is formed.

In the trench gate reverse MOSFET, the longitudinal direction of the trench gate structures is perpendicular to the longitudinal direction of the source region 4 and the body layer 5. Accordingly, as shown in FIG. 3, the longitudinal direction of the contact hole 12a, i.e., the longitudinal direction of the contact region with the source region 4 and the body layer 5 is also perpendicular to the longitudinal direction of the source region 4 and the body layer 5.

Accordingly, a contact width of each of the source region 4 and the body layer 5 contacting the source electrode 11 can be equal to a width of the contact hole 12a. Thus, the contact width according to the present embodiment is wider than a width in a case where both of the source region 4 and the body layer 5 contact the source electrode 11 within a width of the contact hole 12a.

Thus, even when integration of the MOSFET is increased, it is possible to provide a sufficient contact area between the body layer 5 and the source electrode 11 and a sufficient contact area between the source region 4 and the source electrode 11. In a case where it is necessary to provide both of the contact area of the source region 4 and the contact area of the body layer 5 within a width of the contact hole 12a, when the positions of masks for forming the source region 4 and the body layer 5 and a mask for forming the contact hole 12a deviate from proper positions, the contact between the body layer 5 and the source electrode 11 and the contact between the source region 4 and the source electrode 11 may not be formed. However, in the present embodiment, even if the positions of the masks deviate, the contact between the body layer 5 and the source electrode 11 and the contact between the source region 4 and the source electrode 11 are surely formed without being affected by the deviation of the positions of the masks.

A manufacturing method of the SiC semiconductor device is merely provided by changing a layout of masks for forming the source region 4 and the body layer 5 in a conventional manufacturing method. Thus, it is not necessary to change (i.e., add) manufacturing steps. Accordingly, without adding manufacturing steps, the SiC semiconductor device having a structure that the contact area between the source region 4 and the source electrode 11 and the contact area between the body layer 5 and the source electrode 11 are sufficiently wide can be manufactured even when the integration of the device is increased.

Second Embodiment

In a SiC semiconductor device according to a second embodiment, an on-state resistance is improved.

Figure 4:
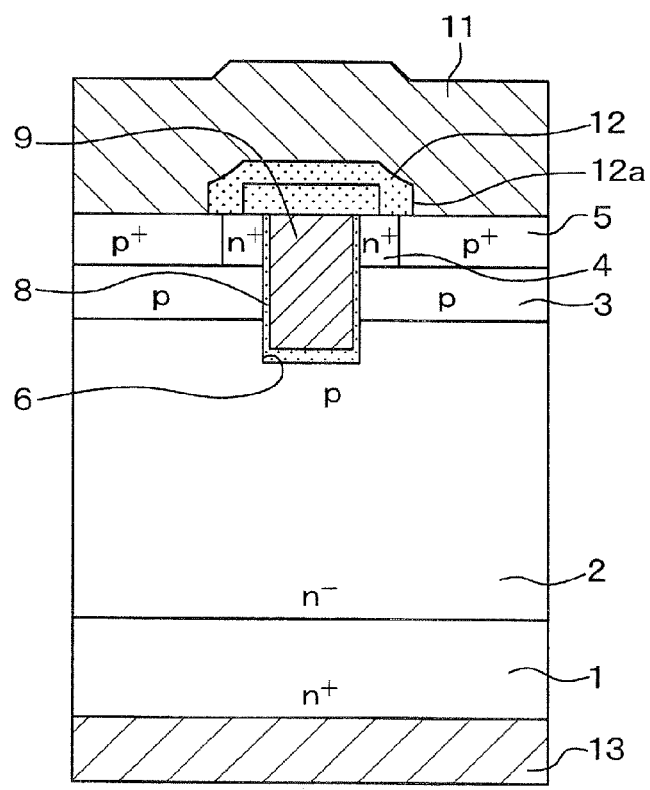
FIG. 4 is a diagram showing a cross sectional view of a MOSFET having a trench gate structure according to a second embodiment.
Figure 5:
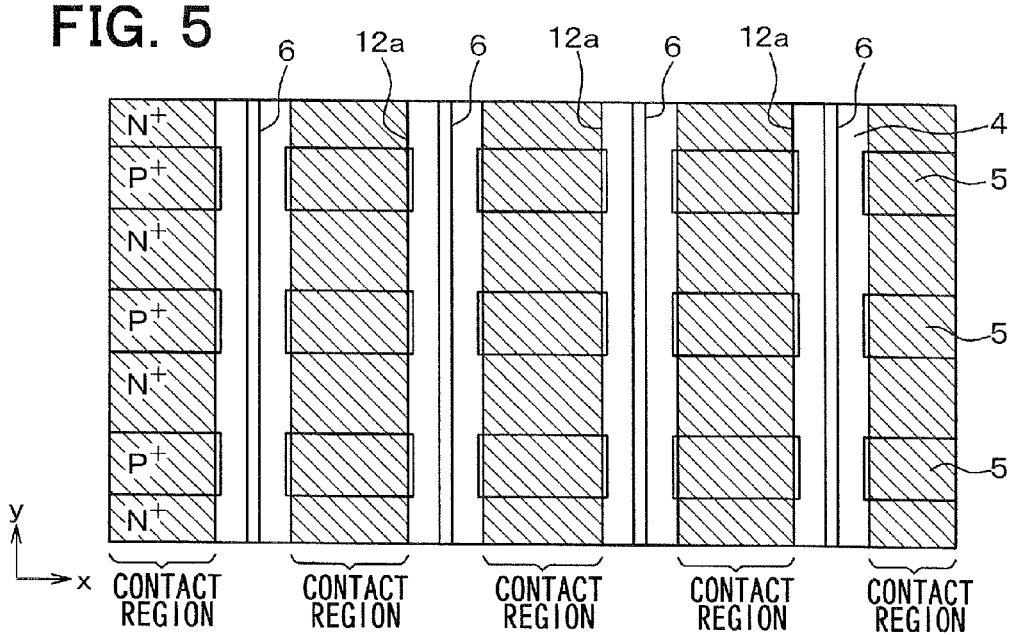
FIG. 5 is a diagram showing an upper plan view of the MOSFET in FIG. 4.

FIG. 4 is a cross sectional view of a MOSFET having a trench gate structure in the SiC semiconductor device. FIG. 4 corresponds to FIG. 2B. FIG. 5 is an upper layout view of the MOSFET in FIG. 4.

The cross sectional structure of the SiC semiconductor device according to the present embodiment is similar to the structure in FIG. 1 other than a cross section of the MOSFET taken along line passing the body layer 5 and perpendicular to the longitudinal direction of the trench structure.

As shown in FIG. 4, in the present embodiment, the body layer 5 is formed at a contact portion with the source electrode 11. The body layer 5 is not formed on a whole of the sidewall of the trench 6 so that the body layer 5 is separated from the trench 6. The source region 4 is formed on the whole of the sidewall of the trench 6. Specifically, the body layer 5 sandwiches the trench gate structure via the source region 4. A part of the source region 4 arranged on the line passing the body layer 5 and perpendicular to the longitudinal direction of the trench structure is covered with the interlayer insulation film 12 so that the part of the source region 4 is not exposed from the contact hole 12a. Alternatively, the part of the source region 4 may be exposed from the contact hole 12a.

In this case, the source region 4 contacting the whole of the sidewall of the trench 6 functions a channel. Thus, in FIG. 1, since the body layer 5 contacts the sidewall of the trench 6, and the body layer 5 does not function as the channel, the on-state resistance is a comparatively high. In the present embodiment, since a portion contacting the whole of the sidewall of the trench 6 functions the channel, the on-state resistance is much improved.

Third Embodiment

A break down voltage in a SiC semiconductor device according to a third embodiment is improved.

Figure 6:
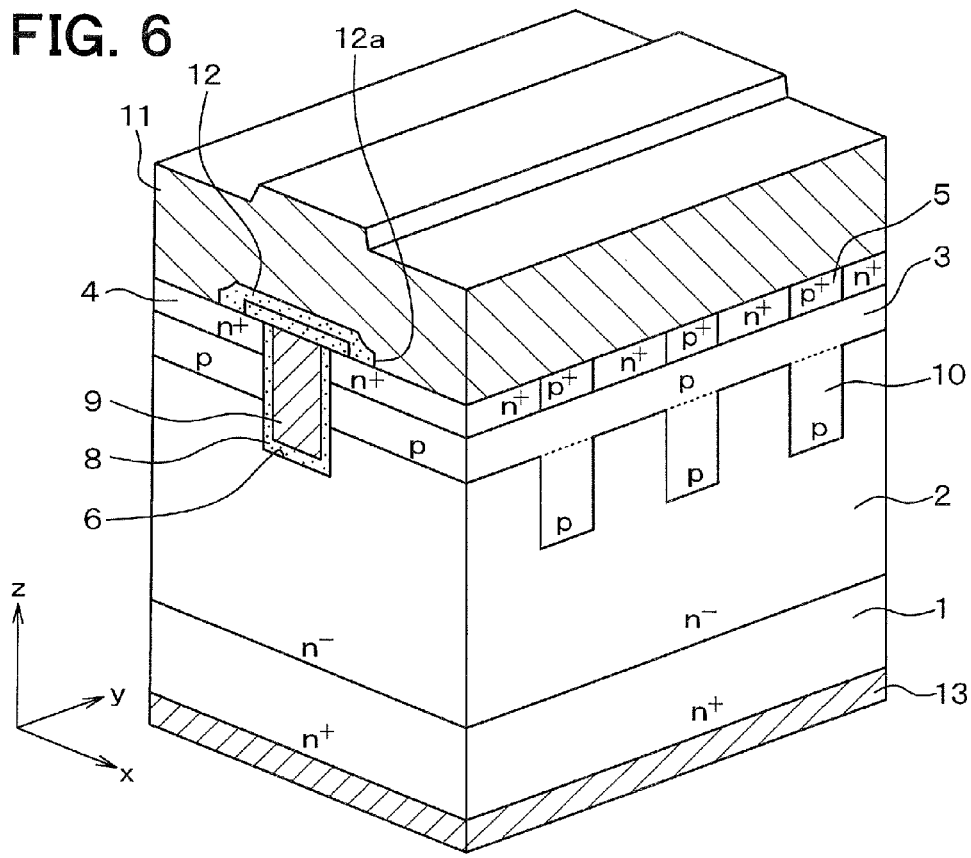
FIG. 6 is a diagram showing a perspective view of a MOSFET having a trench gate structure according to a third embodiment.
Figure 7:
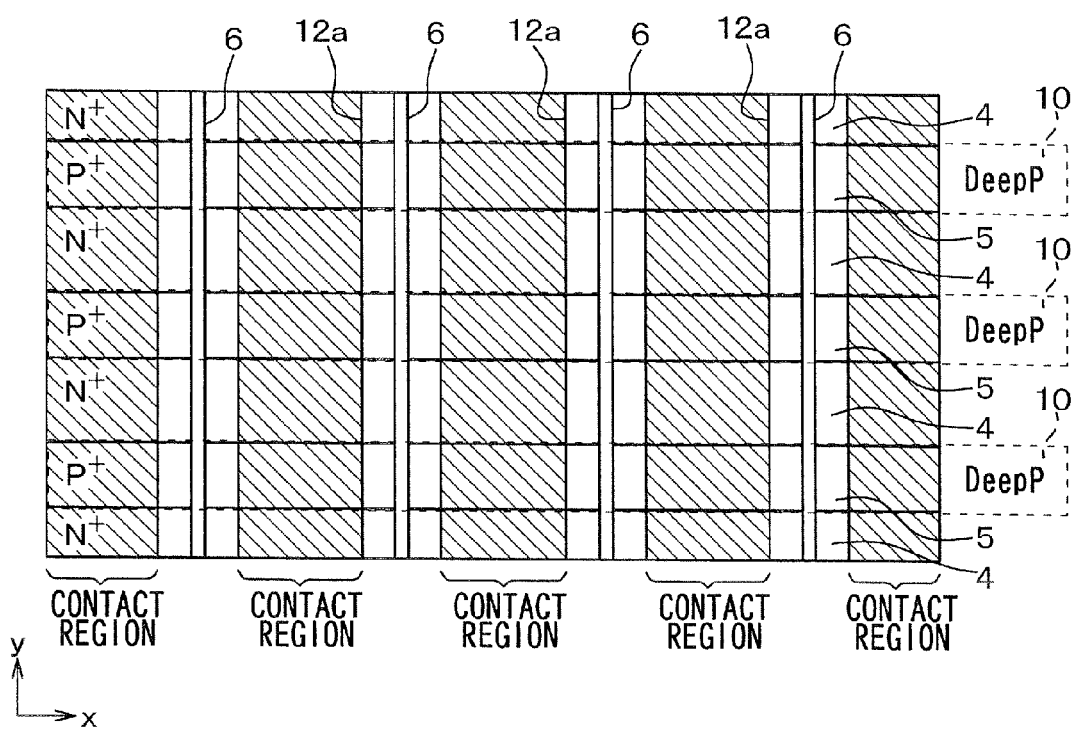
FIG. 7 is a diagram showing an upper plan view of the MOSFET in FIG. 6.

FIG. 6 is a perspective view of a MOSFET having a trench gate structure in the SiC semiconductor device. FIG. 7 is an upper layout view of the MOSFET in FIG. 6.

In the SiC semiconductor device, a P conductive type deep layer 10 is formed in a portion of the drift layer 2, which is disposed under the base region 3 and opposite to the body layer 5. The deep layer 10 extends along with a direction perpendicular to the longitudinal direction of the trench 6, which is a normal direction (i.e., X direction in FIG. 6) of the channel forming portion contacting the sidewall of the trench 6. The deep layer 10 has a depth deeper than the bottom of the trench 6. The depth of the deep layer 10 from the surface of the drift layer 2 is, for example, in a range between 2.6 micrometers and 3.0 micrometers so that the depth of the deep layer 10 from the bottom of the base region 3 is, for example, in a range between 0.6 micrometers and 1.0 micrometer. The P conductive type impurity concentration in the deep layer 10 is in a range between $1.0 \times 10^{17}$ cm$^{-3}$ and $1.0 \times 10^{19}$ cm$^{-3}$. The P conductive type impurity in the deep layer 10 is, for example, born or aluminum.

The deep layer 10 is overlapped on the body layer 5 on the upper layout viewing from the up side of the MOSFET. The width of the deep layer 10 is substantially equal to the body layer 5.

Thus, when the MOSFET includes the deep layer 10, and the MOSFET turns on, the function of the MOSFET is similar to that in FIG. 1 although the channel in the MOSFET is narrower than that in FIG. 1. When the MOSFET turns off, the break down voltage of the MOSFET is improved by the deep layer 10. Specifically, when the MOSFET turns off, in the gate voltage is zero volt. Thus, the electric field is applied between the drain and the source, and therefore, the electric field concentrates at the bottom of the gate oxide film 8. However, since the MOSFET includes the deep layer 10 deeper than the trench 6, the depletion layer at the PN contact between the deep layer 10 and the drift layer 2 expands largely on the drift layer side. Thus, it is difficult to apply the high voltage caused by the drain voltage to the gate oxide film 8. Specifically, when the impurity concentration of the deep layer 10 is higher than the base region 3, the expanding amount of the depletion layer in the drift layer 2 is large. Thus, the electric field concentration at the gate oxide film 8, specifically, the electric field concentration at the gate oxide film 8 on the bottom of the trench 6, is reduced. Thus, the break down of the gate oxide film 8 is restricted.

Accordingly, the MOSFET according to the present embodiment has similar effects as the MOSFET in FIG. 1. Further, the break down voltage of the MOSFET is improved. When the MOSFET includes the deep layer 10, the channel is narrowed in a case where the MOSFET turns on. Thus, the on-state resistance may increase. However, in the MOSFET according to the present embodiment, the on-state resistance does not actually increase. This feature will be explained with reference to FIG. 8.

Figure 8A:
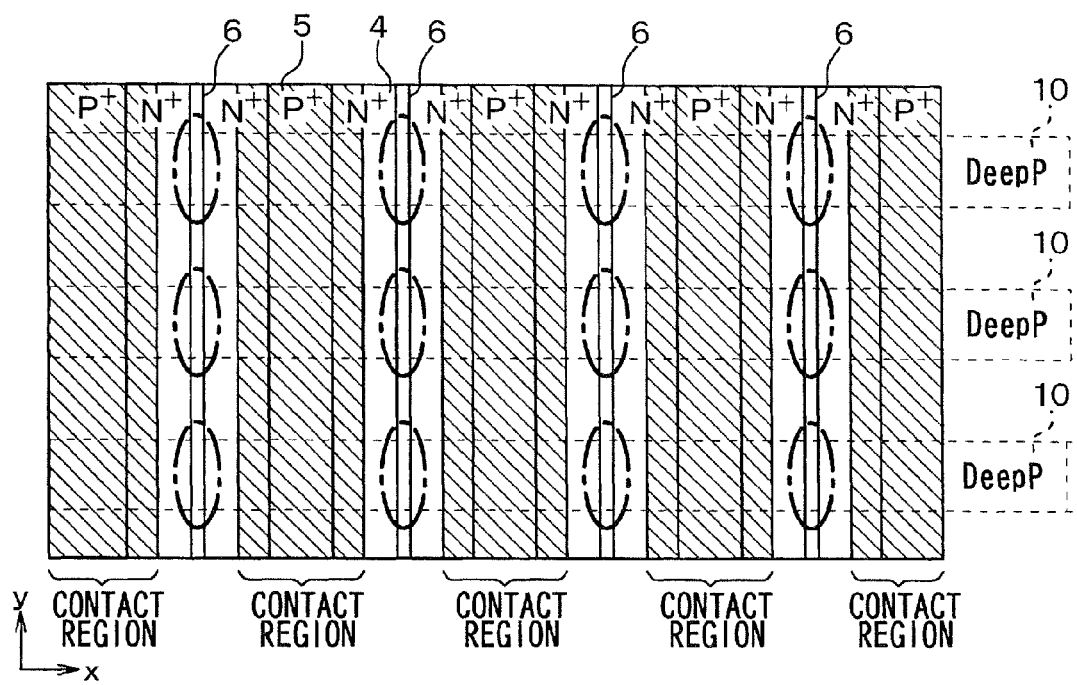
FIG. 8A is a diagram showing an upper plan view of a MOSFET having a P conductive type deep layer in a case where a longitudinal direction of a trench gate structure coincides with a longitudinal direction of a n+ conductive type source region and a P+ conductive type body layer according to a prior art.
Figure 8B:
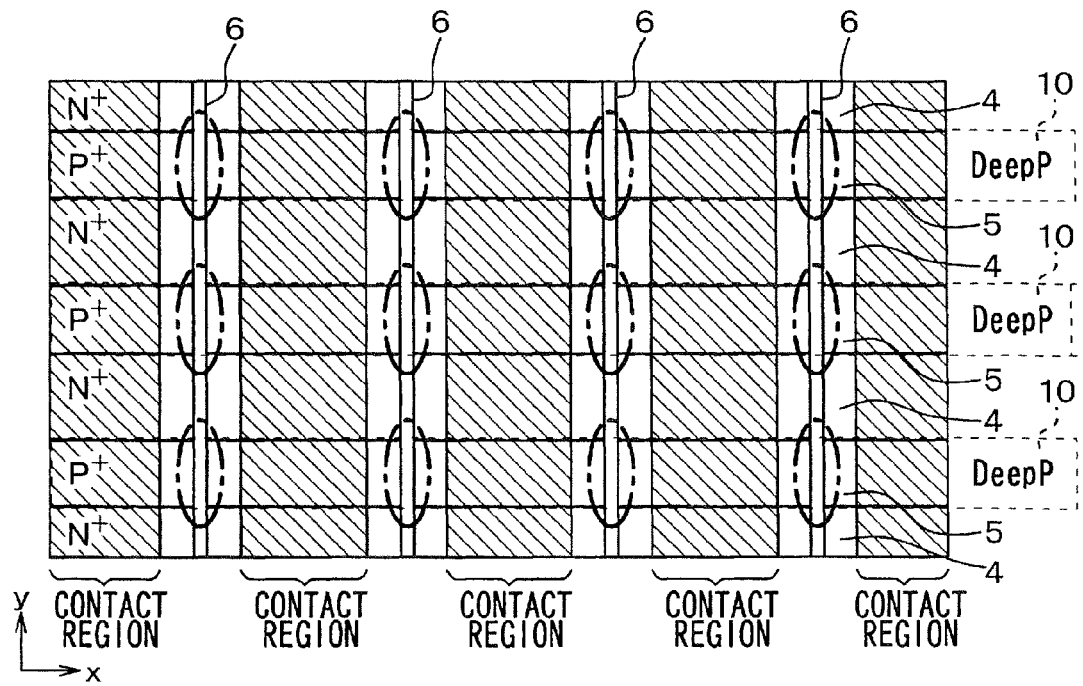
FIG. 8B is a diagram showing an upper plan view of a MOSFET having a P conductive type deep layer according to the third embodiment.
Figure 9A:
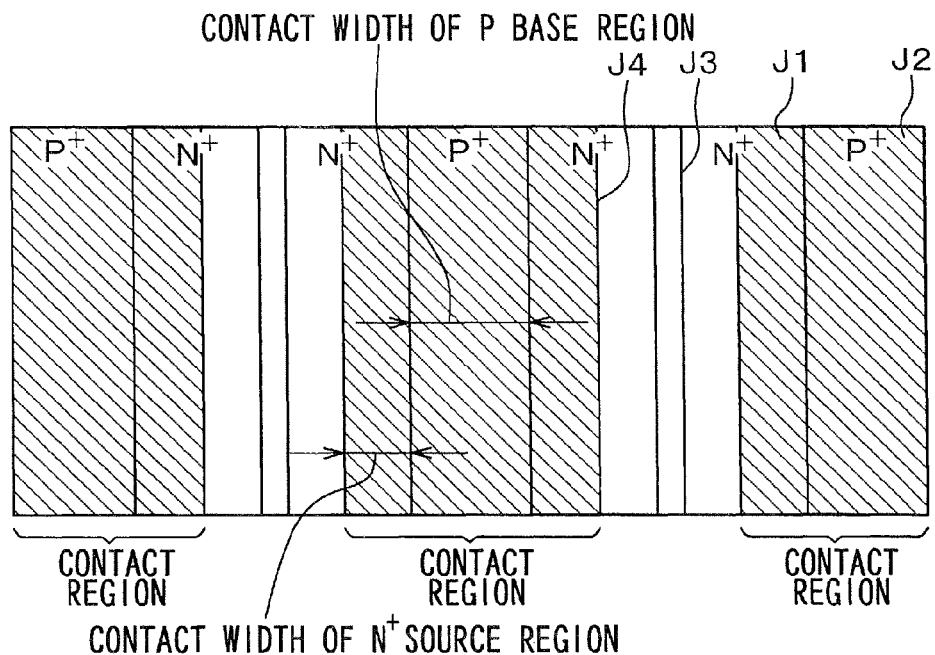
FIG. 9A is a diagram showing an upper plan view of a MOSFET according to a prior art.
Figure 9B:
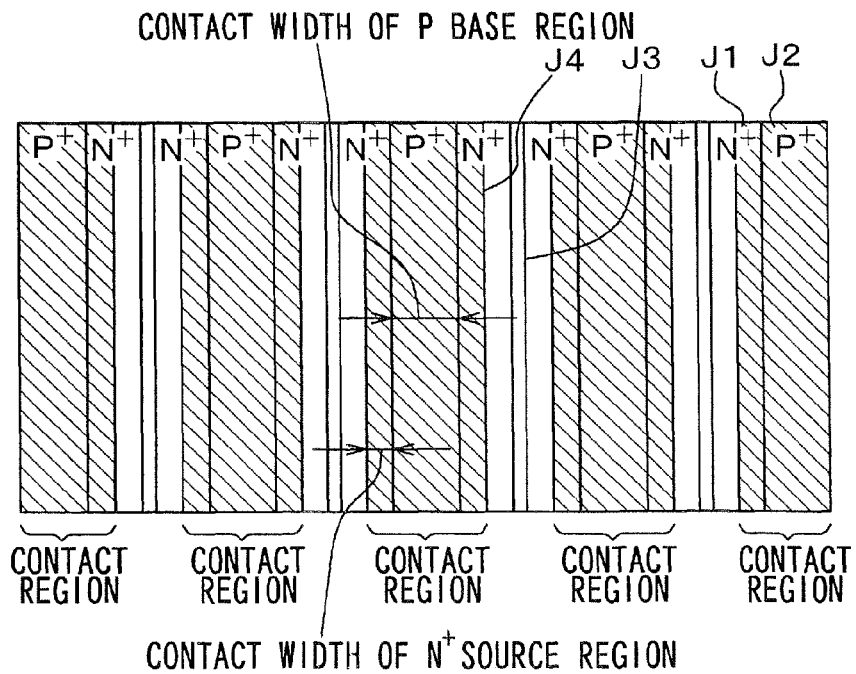
FIG. 9B is a diagram showing an upper plan view of a MOSFET in a case where a cell pitch is a half of the MOSFET in FIG. 9A.

FIG. 8A is an upper layout of a SiC semiconductor device in a case where the longitudinal direction of the trench gate structure coincides with the longitudinal direction of the source region 4 and the body layer 5 when the MOSFET includes the deep layer 10. FIG. 8B is an upper layout of the SiC semiconductor device according to the present embodiment.

As shown in FIG. 8A, even when the longitudinal direction of the trench gate structure coincides with the longitudinal direction of the source region 4 and the body layer 5, a portion (which is surrounded with a dashed-dotted line in FIG. 8A) at which the trench gate structure and the deep layer 10 intersects prevents current from flowing, and therefore, the on-state resistance increases. Accordingly, in FIG. 1, since the longitudinal direction of the trench gate structure crosses the longitudinal direction of the source region 4 and the body layer 5, a portion at which the trench gate structure and the body layer 5 intersects does not function as a channel, and therefore, the on-state resistance increases much more.

However, in the present embodiment, as shown in FIG. 8B, the deep layer 10 and the body layer 5 are overlapped. Further, an area in which the body layer 5 is formed does not function as the channel basically. Accordingly, even when the deep layer 10 is formed in the area, the channel is not narrowed substantially. Thus, the break down voltage is reduced without increasing the on-state resistance, compared with a case where the longitudinal direction of the trench gate structure coincides with the longitudinal direction of the source region 4 and the body layer 5 and a case where the MOSFET does not have deep layer 10.

Other Embodiments

In the above embodiments, the SiC semiconductor device includes the reverse type MOSFET having the trench gate structure. Alternatively, the SiC semiconductor device may include an accumulation type MOSFET having the trench gate structure. Specifically, in the manufacturing method of the MOSFET in FIGS. 1-8B, the gate oxide film 8 may be formed after a N conductive type channel layer is formed on an inner wall of the trench 6. The N conductive type channel layer has a N conductive type impurity concentration of, for example, $1.0 \times 10^{16}$ cm$^{-3}$. The N conductive type impurity is, for example, phosphorous. The N conductive type channel layer provides a channel. The thickness of the channel layer is set to provide a normally off type device. For example, the thickness of the channel layer on the bottom of the trench 6 is set to be in a range between 0.3 micrometers and 1.0 micrometer. The thickness of the channel layer on the sidewall of the trench 6 is set to be in a range between 0.1 micrometers and 0.3 micrometer.

In the above embodiments, the first conductive type is a N conductive type, and the second conductive type is a P conductive type, so that the N channel MOSFET is formed. Alternatively, the conductive type of each portion may be reversed, so that a P channel MOSFET is formed. In the above embodiments, the SiC semiconductor device includes the MOSFET having the trench gate structure. Alternatively, the SiC semiconductor device may include an IGBT having the trench gate structure. In the IGBT, the conductive type of the substrate 1 is changed from the N conductive type to the P conductive type. Other structures of the IGBT are similar to the MOSFET.

In the third embodiment, the deep layer 10 is overlapped on the body layer 5 so that the upper layout of the deep layer 10 coincides with the upper layout of the body layer 5. Both of the deep layer 10 and the body layer 5 are formed by an ion implantation method. Therefore, a leak current may be generated, and the on-state resistance may increase. In order to restrict the leak current, the upper layout of the deep layer 10 may be shifted from the upper layout of the body layer 5.

In the above embodiments, the longitudinal direction of the source region 4 and the body layer 5 is perpendicular to the longitudinal direction of the trench gate structure. Alternatively, it is not necessary to coincide the longitudinal direction of the source region 4 and the body layer 5 with a direction perpendicular to the longitudinal direction of the trench gate structure. Specifically, the source region 4 and the body layer 5 may merely extend to a direction perpendicular to the longitudinal direction of the trench gate structure. More specifically, the source region 4 and the body layer 5 may be divided by the trench gate structure, so that each portion of the source region 4 and the body layer 5 divided in the direction perpendicular to the longitudinal direction of the trench gate structure is arranged. An extending direction of the source region 4 and the body layer 5 may not coincide with the longitudinal direction of each divided portion. For example, the source region 4 and the body layer 5 may have a layout having a square stripe pattern.

The above disclosure has the following aspects.

According to a first aspect of the present disclosure, a SiC semiconductor device includes a reverse type MOSFET. The MOSFET includes: a substrate having a first conductive type or a second conductive type and made of SiC; a drift layer having the first conductive type and made of SiC, wherein the drift layer is disposed on the substrate and has an impurity concentration lower than the substrate; a base region having the second conductive type and made of SiC, wherein the base region is disposed on the drift layer; a base contact layer having the second conductive type and made of SiC, wherein the base contact layer is disposed on the base region and has an impurity concentration higher than the base region; a source region having the first conductive type and made of SiC, wherein the source region is disposed on the base region and has an impurity concentration higher than the drift layer; a plurality of trenches having a stripe pattern in a first direction as a longitudinal direction of the stripe pattern, wherein each trench is disposed on a surface of the source region, penetrates the base region and reaches the drift layer; a gate insulation film disposed on an inner wall of each trench; a gate electrode disposed on the gate insulation film in each trench; an interlayer insulation film covering the gate electrode and having a contact hole, through which the source region and the base contact layer are exposed from the interlayer insulation film; a source electrode electrically coupling with the source region and the base region through the contact hole; and a drain electrode disposed on the substrate and opposite to the drift layer. The MOSFET provides a reverse channel area in a surface portion of the base region, which is disposed on a sidewall of each trench. The MOSFET controls an application voltage to the gate electrode so that the reverse channel area is generated, and the MOSFET flows current between the source electrode and the drain electrode via the source region and the drift layer. The source region and the base contact layer extend along with a second direction, which is perpendicular to the first direction. The source region and the base contact layer are alternately arranged along with the first direction. The contact hole has a longitudinal direction in the first direction.

In the above device, the longitudinal direction of the contact hole, i.e., the longitudinal direction of an boundary between the source electrode and the source region or the base contact layer is perpendicular to the extending direction of the source region and the base contact layer. Accordingly, a boundary width between the source electrode and the source region or the base contact layer is equal to the width of the contact hole. Accordingly, the contact area between the source electrode and the source region or the base contact layer is sufficiently wide. Thus, even when the integration of the device increases, the contact area between the source electrode and the source region or the base contact layer is sufficient.

Alternatively, the base contact layer may contact the sidewall of each trench. The base contact layer is arranged between two adjacent trenches so as to join the two adjacent trenches.

Further, the plurality of trenches may be arranged in parallel to each other along with the second direction. The MOSFET further includes a plurality of cells. One of the cells is provided by: the substrate; the drift layer; the base region disposed on both sides of a corresponding trench; the base contact layer and the source region disposed on both sides of the corresponding trench; the gate insulation film in the corresponding trench; the gate electrode on the gate insulation film in the corresponding trench; the interlayer insulation film covering the gate electrode; the source electrode; and the drain electrode.

Alternatively, the base contact layer may be spaced apart from the sidewall of each trench. The source region is disposed between the sidewall of the trench and the base contact layer. In this case, all of a portion contacting the sidewall of the trench functions as a channel. Thus, the on-state resistance is much reduced.

Alternatively, the SiC semiconductor device may further include: a deep layer having the second conductive type. The deep layer is disposed in a portion of the drift layer under the base region. The deep layer has a bottom, which is deeper than a bottom of the trench. The deep layer extends along with the second direction. The deep layer is arranged opposite to the base contact layer. In this case, the channel is commonly narrowed when the device turns on. Thus, the increase of the on-state resistance is restricted.

According to a second aspect of the present disclosure, a SiC semiconductor device includes an accumulation type MOSFET. The MOSFET includes: a substrate having a first conductive type or a second conductive type and made of SiC; a drift layer having the first conductive type and made of SiC, wherein the drift layer is disposed on the substrate and has an impurity concentration lower than the substrate; a base region having the second conductive type and made of SIC, wherein the base region is disposed on the drift layer; a base contact layer having the second conductive type and made of SiC, wherein the base contact layer is disposed on the base region and has an impurity concentration higher than the base region; a source region having the first conductive type and made of SiC, wherein the source region is disposed on the base region and has an impurity concentration higher than the drift layer; a plurality of trenches having a stripe pattern in a first direction as a longitudinal direction of the stripe pattern, wherein each trench is disposed on a surface of the source region, penetrates the base region and reaches the drift layer; a gate insulation film disposed on an inner wall of each trench; a channel layer having the first conductive type and made of SiC, wherein the channel layer is disposed between the gate insulation film and the base region in each trench; a gate electrode disposed on the gate insulation film in each trench; an interlayer insulation film covering the gate electrode and having a contact hole, through which the source region and the base contact layer are exposed from the interlayer insulation film; a source electrode electrically coupling with the source region and the base region through the contact hole; and a drain electrode disposed on the substrate and opposite to the drift layer. The MOSFET controls an application voltage to the gate electrode so that an accumulation type generated in the channel layer is controlled, and the MOSFET flows current between the source electrode and the drain electrode via the source region and the drift layer. The source region and the base contact layer extend along with a second direction, which is perpendicular to the first direction. The source region and the base contact layer are alternately arranged along with the first direction. The contact hole has a longitudinal direction in the first direction.

In the above device, the longitudinal direction of the contact hole, i.e., the longitudinal direction of an boundary between the source electrode and the source region or the base contact layer is perpendicular to the extending direction of the source region and the base contact layer. Accordingly, a boundary width between the source electrode and the source region or the base contact layer is equal to the width of the contact hole. Accordingly, the contact area between the source electrode and the source region or the base contact layer is sufficiently wide. Thus, even when the integration of the device increases, the contact area between the source electrode and the source region or the base contact layer is sufficient.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A SiC semiconductor device comprising:
   a reverse type MOSFET,
   wherein the MOSFET includes:
      a substrate having a first conductive type or a second conductive type and made of SIC;
      a drift layer having the first conductive type and made of SiC, wherein the drift layer is disposed on the substrate and has an impurity concentration lower than the substrate;
      a base region having the second conductive type and made of SiC, wherein the base region is disposed on the drift layer;
      a base contact layer having the second conductive type and made of SiC, wherein the base contact layer is disposed on the base region and has an impurity concentration higher than the base region;
      a source region having the first conductive type and made of SiC, wherein the source region is disposed on the base region and has an impurity concentration higher than the drift layer;
      a plurality of trenches having a stripe pattern in a first direction as a longitudinal direction of the stripe pattern, wherein each trench is disposed on a surface of the source region, penetrates the base region and reaches the drift layer;
      a gate insulation film disposed on an inner wall of each trench;
      a gate electrode disposed on the gate insulation film in each trench;
      an interlayer insulation film covering the gate electrode and having a contact hole, through which the source region and the base contact layer are exposed from the interlayer insulation film;
      a source electrode electrically coupling with the source region and the base region through the contact hole; and
      a drain electrode disposed on the substrate and opposite to the drift layer,
   wherein the MOSFET provides a reverse channel area in a surface portion of the base region, which is disposed on a sidewall of each trench,
   wherein the MOSFET controls an application voltage to the gate electrode so that the reverse channel area is generated, and the MOSFET flows current between the source electrode and the drain electrode via the source region and the drift layer,
   wherein the source region and the base contact layer extend along with a second direction, which is perpendicular to the first direction,
   wherein the source region and the base contact layer are alternately arranged along with the first direction, and
   wherein the contact hole has a longitudinal direction in the first direction.

2. The SiC semiconductor device according to claim 1,
   wherein the base contact layer contacts the sidewall of each trench, and
   wherein the base contact layer is arranged between two adjacent trenches so as to join the two adjacent trenches.

3. The SIC semiconductor device according to claim 2,
   wherein the plurality of trenches are arranged in parallel to each other along with the second direction,
   wherein the MOSFET further includes a plurality of cells, and
   wherein one of the cells is provided by: the substrate; the drift layer; the base region disposed on both sides of a corresponding trench; the base contact layer and the source region disposed on both sides of the corresponding trench; the gate insulation film in the corresponding trench; the gate electrode on the gate insulation film in the corresponding trench; the interlayer insulation film covering the gate electrode; the source electrode; and the drain electrode.

4. The SiC semiconductor device according to claim 1,
   wherein the base contact layer is spaced apart from the sidewall of each trench, and
   wherein the source region is disposed between the sidewall of the trench and the base contact layer.

5. The SiC semiconductor device according to claim 1, further comprising:
   a deep layer having the second conductive type,
   wherein the deep layer is disposed in a portion of the drift layer under the base region,
   wherein the deep layer has a bottom, which is deeper than a bottom of the trench,
   wherein the deep layer extends along with the second direction, and
   wherein the deep layer is arranged opposite to the base contact layer.

6. A SiC semiconductor device comprising:
   an accumulation type MOSFET,
   wherein the MOSFET includes:
      a substrate having a first conductive type or a second conductive type and made of SiC;
      a drift layer having the first conductive type and made of SiC, wherein the drift layer is disposed on the substrate and has an impurity concentration lower than the substrate;
      a base region having the second conductive type and made of SiC, wherein the base region is disposed on the drift layer;
      a base contact layer having the second conductive type and made of SiC, wherein the base contact layer is disposed on the base region and has an impurity concentration higher than the base region;
      a source region having the first conductive type and made of SiC, wherein the source region is disposed on the base region and has an impurity concentration higher than the drift layer;

a plurality of trenches having a stripe pattern in a first direction as a longitudinal direction of the stripe pattern, wherein each trench is disposed on a surface of the source region, penetrates the base region and reaches the drift layer;

a gate insulation film disposed on an inner wall of each trench;

a channel layer having the first conductive type and made of SiC, wherein the channel layer is disposed between the gate insulation film and the base region in each trench;

a gate electrode disposed on the gate insulation film in each trench;

an interlayer insulation film covering the gate electrode and having a contact hole, through which the source region and the base contact layer are exposed from the interlayer insulation film;

a source electrode electrically coupling with the source region and the base region through the contact hole; and a drain electrode disposed on the substrate and opposite to the drift layer, wherein the MOSFET controls an application voltage to the gate electrode so that an accumulation type generated in the channel layer is controlled, and the MOSFET flows current between the source electrode and the drain electrode via the source region and the drift layer, wherein the source region and the base contact layer extend along with a second direction, which is perpendicular to the first direction, wherein the source region and the base contact layer are alternately arranged along with the first direction, and wherein the contact hole has a longitudinal direction in the first direction.

7. The SiC semiconductor device according to claim 6, wherein the base contact layer contacts the sidewall of each trench, and wherein the base contact layer is arranged between two adjacent trenches so as to join the two adjacent trenches.

8. The SiC semiconductor device according to claim 7, wherein the plurality of trenches are arranged in parallel to each other along with the second direction, wherein the MOSFET further includes a plurality of cells, and wherein one of the cells is provided by: the substrate; the drift layer; the base region disposed on both sides of a corresponding trench; the base contact layer and the source region disposed on both sides of the corresponding trench; the gate insulation film in the corresponding trench; the gate electrode on the gate insulation film in the corresponding trench; the interlayer insulation film covering the gate electrode; the source electrode; and the drain electrode.

9. The SiC semiconductor device according to claim 6, wherein the base contact layer is spaced apart from the sidewall of each trench, and wherein the source region is disposed between the sidewall of the trench and the base contact layer.

10. The SiC semiconductor device according to claim 6, further comprising:

a deep layer having the second conductive type, wherein the deep layer is disposed in a portion of the drift layer under the base region, wherein the deep layer has a bottom, which is deeper than a bottom of the trench, wherein the deep layer extends along with the second direction, and wherein the deep layer is arranged opposite to the base contact layer.

* * * * *